(12) United States Patent
He et al.

(10) Patent No.: US 6,867,119 B2
(45) Date of Patent: Mar. 15, 2005

(54) NITROGEN OXIDATION TO REDUCE ENCROACHMENT

(75) Inventors: Yue-Song He, San Jose, CA (US); Richard M. Fastow, Cupertino, CA (US); Zhi-Gang Wang, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 143 days.

(21) Appl. No.: 10/284,866

(22) Filed: Oct. 30, 2002

(65) Prior Publication Data

US 2004/0084711 A1 May 6, 2004

(51) Int. Cl.$^7$ ................ H01L 21/3205; H01L 21/4763

(52) U.S. Cl. ................................................ 438/585

(58) Field of Search ................ 438/584–585, 438/593–595, 800

(56) References Cited

U.S. PATENT DOCUMENTS

| | | | | |
|---|---|---|---|---|
| 5,966,606 A | * | 10/1999 | Ono | 438/303 |
| 5,972,761 A | | 10/1999 | Wu | 438/305 |
| 6,200,840 B1 | | 3/2001 | Chen et al. | 438/184 |
| 6,211,045 B1 | | 4/2001 | Liang et al. | 438/585 |

* cited by examiner

Primary Examiner—Craig A. Thompson

(57) ABSTRACT

A method of manufacturing a metal oxide semiconductor. A gate structure of the metal oxide semiconductor is etched. A nitrogen-comprising gas, which may be NO or $N_2O$, is made to flow over the metal oxide semiconductor. A pre-implant film is grown over the edges of the gate structure. The pre-implant film may repair damage to a gate stack edge caused by an etching process. The film may be substantially silicon nitride. Beneficially, such a film may be thinner than a conventional silica oxide film. A thinner film does not deleteriously contribute to non-uniformities in a tunnel oxide. A non-uniform tunnel oxide may result in a non-uniform field between a gate and a channel. Non-uniform fields may have numerous deleterious effects. Advantageously, embodiments of the present invention overcome prior art deficiencies in repairing gate stack edge defects. In this novel manner, gate stack edge defects may be physically repaired without deleterious consequences to the electrical behavior of a metal oxide semiconductor device. The novel application of silicon nitride to this application allows thin repair layers to be grown. Advantageously, semiconductors manufactured using embodiments of the present invention may utilize smaller process feature sizes, resulting in denser arrays of semiconductor devices, resulting in lower costs for such devices and realizing a competitive advantage to practitioners of the improvements in the arts herein described.

14 Claims, 9 Drawing Sheets

NITROGEN OXIDATION TO REDUCE ENCROACHMENT

TECHNICAL FIELD

Embodiments of the present invention relate to design and manufacture of sub-micron metal oxide semiconductors. More particularly, embodiments of the present invention provide nitrogen oxidation to reduce encroachment.

BACKGROUND ART

Flash memory is a type of semiconductor computer memory with many desirable characteristics. Like read only memory, ROM, it is non-volatile, meaning that the contents of the memory are stable and retained without applied electrical power.

Flash memory devices have found wide commercial success in the electronic device market. A major advantage of flash over ROM is that the memory contents of flash may be changed after the device is manufactured. Flash memory has found wide acceptance in many types of computers, including desktop computers, mobile phones and hand held computers. Flash memory is also widely used in digital cameras and portable digital music players, for example "MP3" players.

In addition to direct flash storage applications, for example in video cameras, flash-based storage devices are replacing rotating magnetic disks, sometimes known as hard drives, in many applications. Compared to hard drives, flash is significantly more rugged, quieter, lower power, and for some densities such a flash based device may be smaller than a comparable hard drive.

FIG. 1 shows a Metal Oxide Semiconductor (MOS) memory cell 10 as has been well known in the conventional art. Regions 14 are the drain and/or source regions for memory cell 10. They may be used as source and/or drain interchangeably. Control gate 16 is used to control the operation of memory cell 10. A channel region 17 is formed between source/drain regions 14. Feature size 18 is the nominal size of the smallest feature that can be created by a particular semiconductor process. In memory cells of this type, the gate 16 width and channel 17 length typically correspond approximately to feature size 18.

Memory cell 10 may be one of two general types of non-volatile memory, a "floating gate" cell or a nitride read only memory (NROM) cell. In a floating gate cell, layer 12B of the gate stack is typically conductive polysilicon. Layers 12A and 12C are insulating materials which isolate or "float" gate layer 12B, which is usually referred to as a floating gate. In some floating gate cells, Layer 12A may be a "triple stack" of oxide, nitride and oxide, generally known as "ONO." Layer 12C is commonly referred to as a tunnel oxide layer. Floating gate 12B is the storage element of memory cell 10.

Silicon-Oxide-Nitride-Oxide-Silicon (SONOS) is another common type of flash memory cell. The SONOS stack is a gate dielectric stack and consists of a single layer of polysilicon, a triple stack ONO (Oxide-Nitride-Oxide) gate dielectric layer and a MOS channel 17. The ONO structure may consist of a tunnel oxide 12A, a nitride memory storage layer 12B and a blocking oxide layer 12C.

Flash memory devices are typically configured as an array of many instances of individual cells, e.g., cell 10, oriented in rows and columns. Typically, the control gates, e.g., control gate 16 of FIG. 1, of the cells in each row are connected to a series of word lines, thus forming individual rows of cells that can be accessed by selecting the corresponding word line. Similarly, the source and/or drain, e.g., regions 14, of the cells in each column are connected to a series of bit lines, thus forming individual columns of cells that can be accessed by selecting the corresponding bit lines.

To read a bit stored in memory cell 10, a word line is brought to a read voltage of about 4.5 volts and a bit line is grounded. Node 14A (the "left" instance of regions 14) functions as a source for the cell, and current flows from node 14B, acting as a drain, to node 14A through a bit line to ground. Sensing logic connected to the bit line can interpret the magnitude of the current (which is affected by the amount of charge stored in floating gate layer 12B) in order to determine if a bit is stored in cell 10.

To write (or program) a bit into memory cell 10, a word line is brought to a programming voltage of about 9.5 volts, the drain is biased at about 5 volts and a source is grounded. Current is sourced from the word line through node 14A into a bit line. The current causes hot carrier injection of charge into the floating gate layer 12B of the gate stack.

Memory device manufacturers are continually challenged to provide ever greater amounts of memory at ever lower costs. A primary approach employed to achieve lower memory costs is the industry-wide on-going reduction in semiconductor feature size. By making features, such as signal lines and transistors smaller, more memory devices may be placed in a given die area, resulting in lower production costs.

A modern integrated circuit, IC, for example a flash memory device, may have millions to hundreds of millions of devices made up of complex, multi-layered structures that are fabricated through hundreds of processing steps. Those structures, for example a gate stack (16, 12A, 12B and 12C), are formed by repeated deposition and patterning of thin films on a silicon substrate, also known as a wafer.

For example, a structure above the surface of a wafer may be formed by depositing polysilicon over the entire wafer, followed by the application of a photosensitive polymer layer, known as photoresist. The photoresist-covered wafer is exposed to a light source, usually a narrow band of ultraviolet light, for example, from a mercury lamp. A mask is used to shield portions of the wafer from the light, creating an exposure pattern on the wafer. The light energy changes the chemical nature of the photoresist. A developing solution is then used to remove the photoresist in the areas exposed to the light source. This sequence of steps is known as photolithography.

The pattern of remaining photoresist (which was the mask pattern) is then recreated in the underlying film (e.g., the layer of polysilicon) by etching away the material that is not protected by photoresist. In a subsequent processing step, the photoresist is chemically removed.

FIGS. 2A through 2D illustrate an exemplary photolithography to form a gate stack of a floating gate memory cell 10, as is well known in the conventional art. In FIG. 2A, tunnel oxide layer 212C has been grown by conventional means over wafer 210. Polysilicon layer 212B has been deposited over tunnel oxide layer 212C. Layer 212A, which may be an ONO stack, has been put in place, and polysilicon layer 212A has been deposited. Note that layers 212A, 212B, 212C and 216 cover large portions of wafer 210.

A layer of photoresist 220 is then deposited over the previously described layers. In FIG. 2B, light energy 240 is directed at photoresist layer 220. A mask structure 230 blocks some areas of photoresist layer 220 from receiving light energy 240.

In FIG. 2C, the photoresist has been developed. Areas of photoresist that received (were exposed to) the light energy 240 are removed by the developing process. Wafer 210 subsequently undergoes an etching process. As described previously, an etching process removes material where photoresist material is not present. After etching, and a subsequent removal of the remaining photoresist material, substantial portions of memory cell 10 are formed.

The gate length, generally corresponding approximately with minimum feature size 18, is one of the most critical features of a Metal Oxide Semiconductor, MOS, device. For example, gate length generally determines the channel, e.g., channel region 17, length. When a field-effect transistor in a MOS device is in the "on" state, it conducts current between a drain and a source. The shorter the distance between a drain and a source, the shorter the distance that charge carriers, e.g., electrons or "holes," must travel. In general, charge carriers travel at a constant speed in a uniform material. (Speed may vary according to differing types of material and different types of charge carriers.) Therefore, a short channel produces a faster or higher speed transistor. A shorter channel also beneficially decreases the size of a semiconductor device, and consequently increases the density of an array of semiconductor devices. Up to a certain point, which generally varies from design to design, shorter channels corresponding to faster transistors, are considered desirable. However, if a channel becomes too short, the device may suffer from what is known as the "short channel effect."

As channel length grows shorter, threshold voltage, the voltage required to turn on a transistor, begins to decrease and leakage current increases. These effects are commonly referred to in the semiconductor arts as the "short channel effect." An increase in leakage current is particularly onerous in flash memory devices as flash has found wide acceptance in very low power applications, for example mobile phones, due to the ability of flash to retain information without applied power. Increases in leakage current may have a significant deleterious effect on total power consumption of the flash device and the product using the flash device.

FIG. 3 illustrates two common effects of etching a gate stack, as are well known in the conventional art. Regions 310 represent a portion of polysilicon layer 12B which has been "undercut" due to over etching and/or damage due to ultraviolet irradiation from an etching plasma. Regions 320 illustrate similar damage to the wafer substrate 210 associated with the etching process. Regions 310 and 320 may be, for example, from two to ten angstroms high. Regions 310 and 320 typically occur at the edge of a gate structure and are frequently referred to as gate edge or gate stack edge defects. Such defects may cause tunnel oxide reliability problems. To reduce or eliminate the damaged oxide at the gate edge, a gate oxidation process is introduced after the etch process. Post-gate etch oxidation is generally very effective in improving the oxide quality at the gate edge.

Unfortunately, as feature size 18 decreases to, for example, about 0.3 microns and smaller, the postgate etch oxidation process may cause oxide encroachment issues. More particularly, the thickened oxide at the gate edge becomes a greater percentage of the length of the tunnel oxide as the overall length of the tunnel oxide decreases. Defects in a tunnel oxide, for example regions 310 and 320, produce a non-uniform tunnel oxide. More particularly, a tunnel oxide layer may not be the same thickness across its length and width. A non-uniform tunnel oxide in turn produces a non-uniform field between a floating gate, e.g., floating gate 12B and a channel region, for example channel region 210. A non-uniform field between a floating gate and a channel region produces an unacceptably wide threshold voltage distribution during erase operations on an array of memory cells.

FIG. 4 is a graph 410 of two distributions of threshold voltages for an array of floating gate memory cells. The X-axis represents erase threshold voltage and the Y-axis represents a number of cells from an array demonstrating the indicated erase threshold voltage. Distribution 420 is a desirable "tight" distribution of erase threshold voltages corresponding to well constructed cells. Distribution 430 is an undesirable "wide" distribution of erase threshold voltages corresponding to cells comprising tunnel oxide defects, for example due to a non-uniform tunnel oxide across a channel.

A wide distribution of erase threshold voltages such as described by distribution 430 may result in deleterious effects upon the operation of a flash memory device. For example, cells with erase threshold voltages in region 440 of distribution 430 may erase very slowly or not at all. Cells with erase threshold voltages in region 450 of distribution 430 may erase very fast. Cells which erase fast contribute to "column leakage," an undesirable effect in which too much current flows in bit lines, for example source or drain 14 in cell 10 (FIG. 1). A highly deleterious consequence of column leakage is that cells may appear to be erased when in fact such cells have not been erased. As the ability to erase flash memory cells is crucial to the advantages of flash memory devices, a false indication of erasure amounts to a failure of the device.

Conventionally, such damage was removed by thermal cycling, also known as annealing, of the semiconductor wafer. Additionally, new silicon oxide was frequently grown to fill in the gaps, for example regions 310. Conventionally, oxide, $SiO_2$, particularly oxide to repair gate stack edge defects, is grown in flowing pure molecular oxygen, $O_2$. This step of growing oxide after etching a gate stack is commonly described as a pre-implant oxide. (Implanting is a subsequent step that may, for example, form source/drain regions 14.)

A well known characteristic of growing oxide in pure oxygen is that it is generally not feasible to 40 produce an oxide layer of less that about 75 angstroms via this technique. A typical conventional pre-implant oxide may be, for example, from 75 to 100 angstroms thick. Pre-implant oxide thicknesses of less than about 75 angstroms have generally not produced sufficient repair of gate stack edge defects.

Unfortunately, as feature size 18 decreases to, for example, about 0.3 microns and smaller, pre-implant oxides that are 75 to 100 angstroms thick contribute to tunnel oxide non-uniformities. Consequently, such oxides do not improve the erase threshold voltage distribution. They may even contribute to a widening of such distributions.

Semiconductor processing equipment is extremely expensive. Fundamental semiconductor processing steps, e.g., implantation, diffusion and etching, typically require long periods of development and extensive qualification testing. Implementing a new fabrication process requires considerable resources on the part of the semiconductor manufacturer. A manufacturer may have to alter or entirely revamp process libraries and process flows in order to implement a new fabrication process. Additionally, re-tooling a fabrication line is very expensive, both in terms of direct expenses as well as in terms of opportunity cost due to the time required to perform the re-tooling. Consequently, any solution to repair damage to gate stack oxides should be compatible with existing semiconductor processes and equipment without the need for revamping well established tools and techniques.

Accordingly, a need exists to repair damage to gate stack oxides. A further need exists for repairing gate stack oxides in flash memory devices which does not contribute to wide erase threshold voltage distributions. A still further need exists for the above mentioned needs to be achieved with existing semiconductor processes and equipment without revamping well established tools and techniques.

DISCLOSURE OF THE INVENTION

Embodiments of the present invention provide a means to repair damage to gate stack oxides. Further embodiments of the present invention provide for repairing gate stack oxides in flash memory devices without contributing to wide erase threshold voltage distributions. Still further embodiments of the present invention provide for the above mentioned solutions to be achieved with existing semiconductor processes and equipment without revamping well established tools and techniques.

A method of manufacturing a metal oxide semiconductor is disclosed. A gate structure of the metal oxide semiconductor is etched. A nitrogen-comprising gas, which may be NO or $N_2O$, is made to flow over the metal oxide semiconductor. A pre-implant film is grown over the edges of the gate structure. The pre-implant film may repair damage to a gate stack edge caused by an etching process. The film may be substantially silicon nitride. Beneficially, such a film may be thinner than a conventional silica oxide film. A thinner film does not deleteriously contribute to non-uniformities in a tunnel oxide. A non-uniform tunnel oxide may result in a non-uniform field between a gate and a channel. Non-uniform fields may have numerous deleterious effects. Advantageously, embodiments of the present invention overcome prior art deficiencies in repairing gate stack edge defects.

In this novel manner, gate stack edge defects may be physically repaired without deleterious consequences to the electrical behavior of a metal oxide semiconductor device. The novel application of silicon nitride to this application allows thin repair layers to be grown. Beneficially, such thin layers do not contribute non-uniform discontinuities to tunnel oxide layers. Advantageously, semiconductors manufactured using embodiments of the present invention may utilize smaller process feature sizes, resulting in denser arrays of semiconductor devices, resulting in lower costs for such devices and realizing a competitive advantage to practitioners of the improvements in the arts herein described.

BEST MODE FOR CARRYING OUT THE INVENTION

In the following detailed description of the present invention, nitrogen oxidation to reduce encroachment, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail so as not to unnecessarily obscure aspects of the present invention.

Nomenclature

It is to be appreciated that the use of the term "oxidation" and similar forms is intended to be consistent with the use of the terms in the semiconductor arts rather than as used more precisely in the chemical disciplines. Within the semiconductor arts, "oxide" and "oxidation" may refer to materials and to processes that produce such materials via methods similar to oxidation. For example, if silicon dioxide, "oxide," is grown in an oven at elevated temperatures in an oxygen atmosphere, then silicon nitride, grown in a similar oven at similar temperatures in, for example, a nitrous oxide atmosphere, may also be called an "oxide." Similarly, a layer of material with a function similar to a layer that has conventionally been comprised of silica, e.g., a tunnel oxide, may also generally be called an oxide layer, even though it may not strictly comprise oxygen.

Nitrogen Oxidation to Reduce Encroachment

Embodiments of the present invention are described in the context of design and manufacture of flash memory devices. However, it is appreciated that embodiments of the present invention may be utilized in other areas of electronic design and operation.

A conventional process to repair gate stack edge defects caused by an etching process is to grow a layer of "oxide" (silica, $SiO_2$) over the wafer surface. The process involves placing a wafer in an oven and flowing molecular oxygen ($O_2$) over the wafers for a period of time. This layer of oxide generally differs from other oxide layers in a semiconductor. A notable difference is that most oxide layers are substantially planar, and parallel to the wafer surface. The "repair layer" of oxide resembles a conformal coating, for example, growing along vertical edges of a semiconductor device, perpendicular to the wafer surface. It is to be appreciated that this is an illustrative difference rather than a definition.

A layer of oxide grows from the silicon substrate under the influence of heat and oxygen. As previously described, this conventional process grows a minimum oxide thickness of about 75 angstroms or thicker. However, for newer semiconductors with gate lengths less than about 0.3 microns, a silica layer of 75 angstroms has been found to be too thick, resulting in non-uniform tunnel oxide across the channel.

Figure 5:
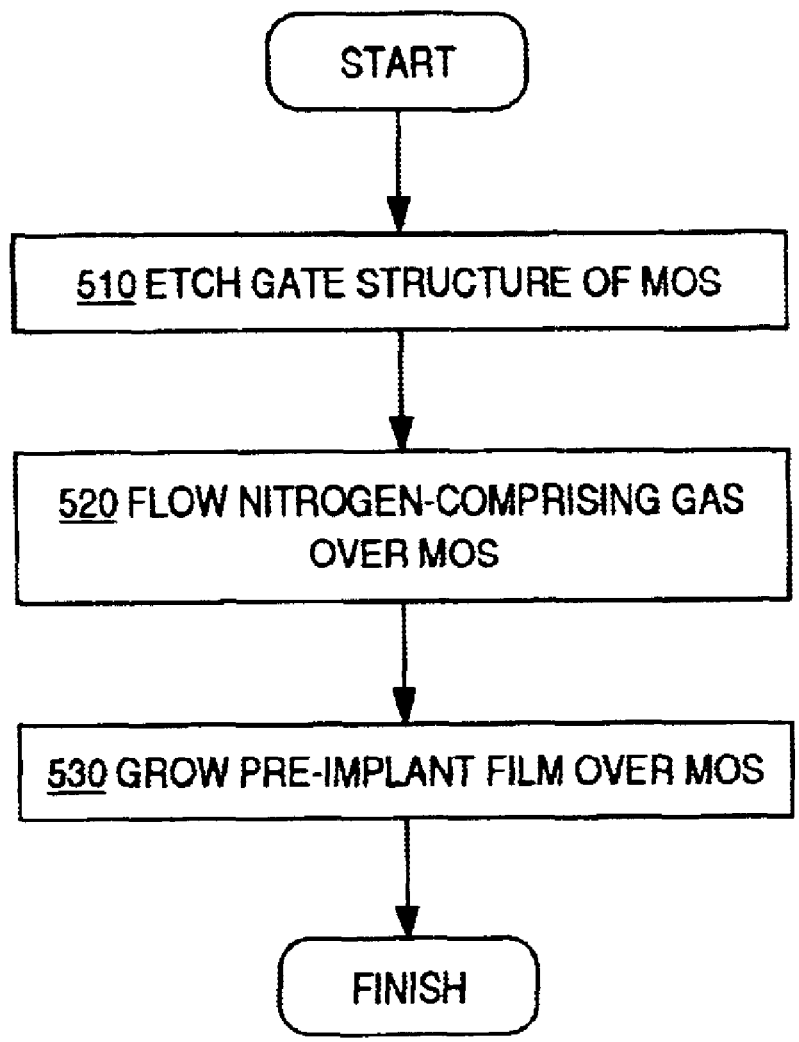
FIG. 5 illustrates a method of manufacturing a metal oxide semiconductor, according to an embodiment of the present invention.

FIG. 5 illustrates a method 500 of manufacturing a metal oxide semiconductor, according to an embodiment of the present invention.

In step 510 a gate structure of a metal oxide semiconductor is etched. The etching is typically performed via bombardment by a plasma. Plasma etching occurs through a variety of mechanisms, including, for example, physical sputtering, simple chemical attack, chemical attack induced by energetic ions and preferential chemical attack due to ion-enhanced protection of sidewalls. The end result of etching is the removal of material. The layers remaining form a gate stack.

An unfortunate consequence of gate stack etching is damage to a tunnel oxide layer. It has not proven commercially feasible to prevent such damage. Consequently, most semiconductor manufacturers include process steps to repair such damage in their typical manufacturing process flow.

In step 520, a nitrogen-comprising gas is made to flow over the metal oxide semiconductor, typically as a part of a wafer. In contrast to the conventional art method of flowing molecular oxygen, a nitrogen-comprising gas, for example nitric oxide, NO, or nitrous oxide, $N_2O$, is used.

In step 530, a pre-implant film is grown over the edges of the gate structure. Due to the presence of nitrogen in the growing atmosphere, the film comprises nitrogen, rather than being substantially $SiO_2$. More particularly, the pre-implant "oxide" layer is substantially silicon nitride. Beneficially, silicon nitride grows more slowly than silica, resulting in finer process control capabilities. As an advantageous consequence, a pre-implant film may be grown in thinner layers as silicon nitride as opposed to silica. More particularly, silicon nitride film thicknesses of less than 60 angstroms, for example 50 or 25 angstroms, are commercially feasible. Such thicknesses have demonstrated the capacity to repair gate stack edge defects without deleterious consequences.

An additional benefit of silicon nitride is that it has a higher dielectric constant (7) than silica (3.9). A higher dielectric constant contributes to lower leakage currents in areas where silicon nitride has replaced missing silica in gate stack edge defects.

Figure 3:
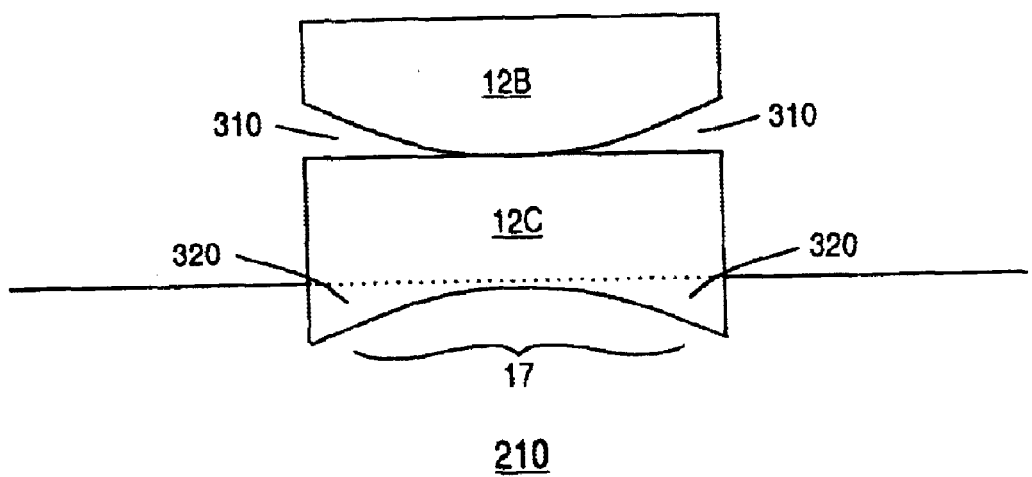
FIG. 3 illustrates two common effects of etching a gate stack, as are well known in the conventional art.
Figure 4:
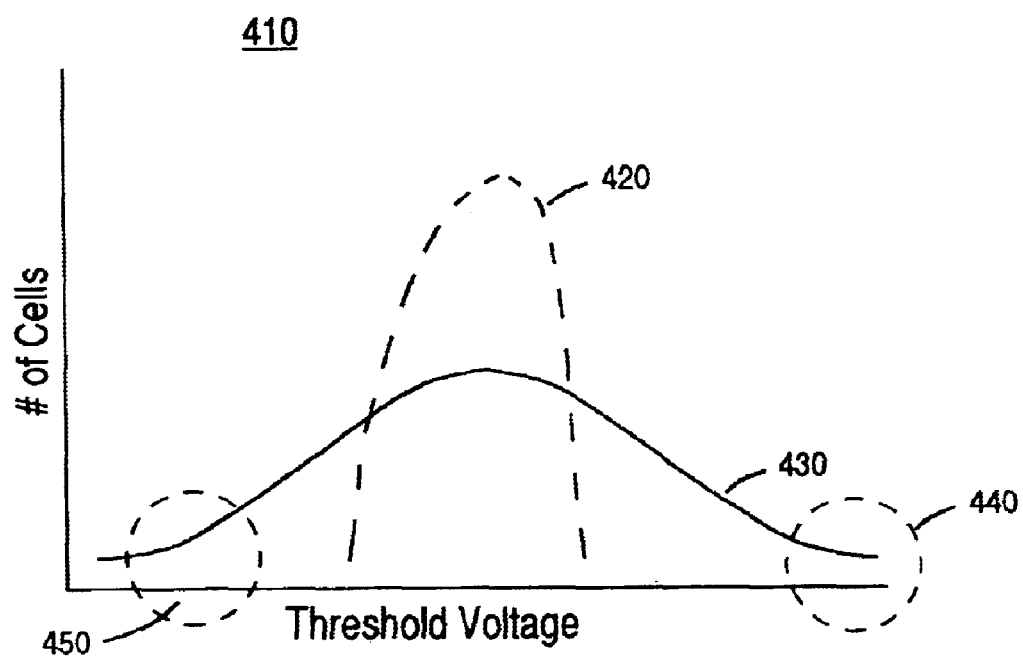
FIG. 4 illustrates a graph of two distributions of threshold voltages for an array of floating gate memory cells.
Figure 6:
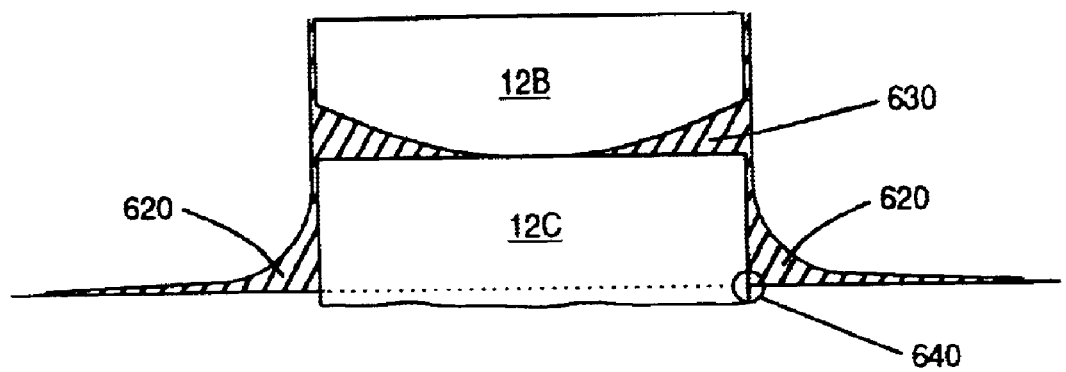
FIG. 6 illustrates portions of a floating gate memory cell, according to an embodiment of the present invention.

FIG. 6 illustrates portions of a floating gate memory cell 650, according to an embodiment of the present invention. Floating gate memory cell 650 comprises a substrate 210, a tunnel oxide 12C, and a floating gate 12B. As illustrated in FIG. 3 (conventional art), portions of floating gate 12B were damaged by an etching process. After processing to repair gate stack etching damage, for example, by process 500 described above, a pre-implant film 620 has bee grown over the edges of the gate structure of floating gate memory cell 650. Typically, pre-implant film may also cover portions of substrate 620 exposed by an etching process.

Notably, region 630, corresponding to edge defect 310 as depicted in FIG. 3, has been substantially filled by growth of pre-implant film 620. It is to be appreciated that the growth of pre-implant film 620 need not precisely fill region 630 to realize beneficial results, according to an embodiment of the present invention.

Figure 1:
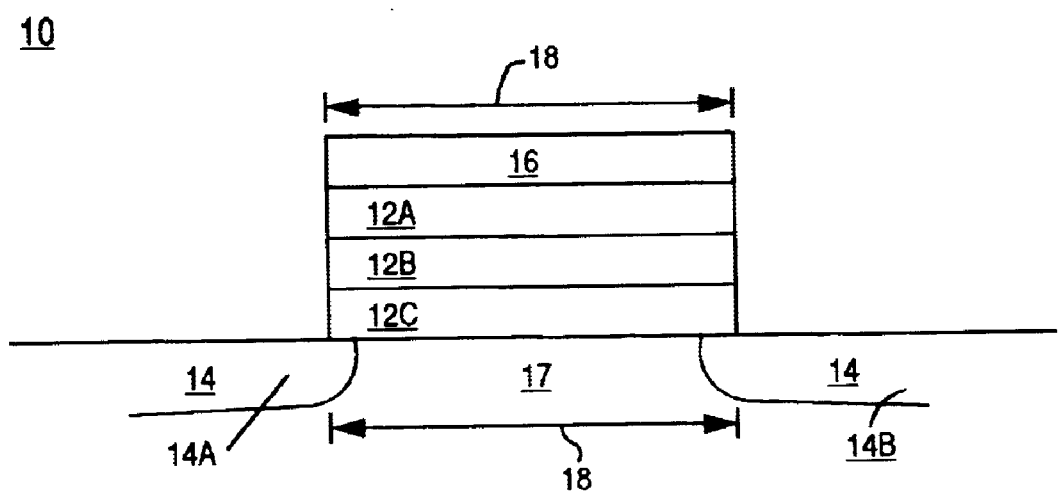
FIG. 1 shows a memory cell as has been well known in the conventional art.
Figure 2A:
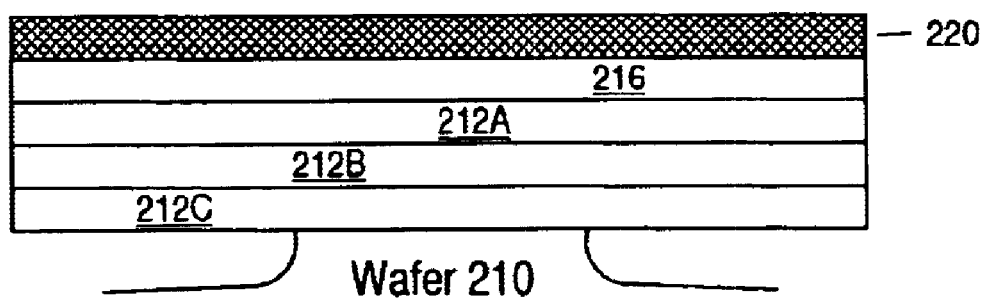
FIGS. 2A, 2B, 2C and 2D illustrate an exemplary photolithography to form a gate stack of a floating gate memory cell 10, as is well known in the conventional art
Figure 2B:
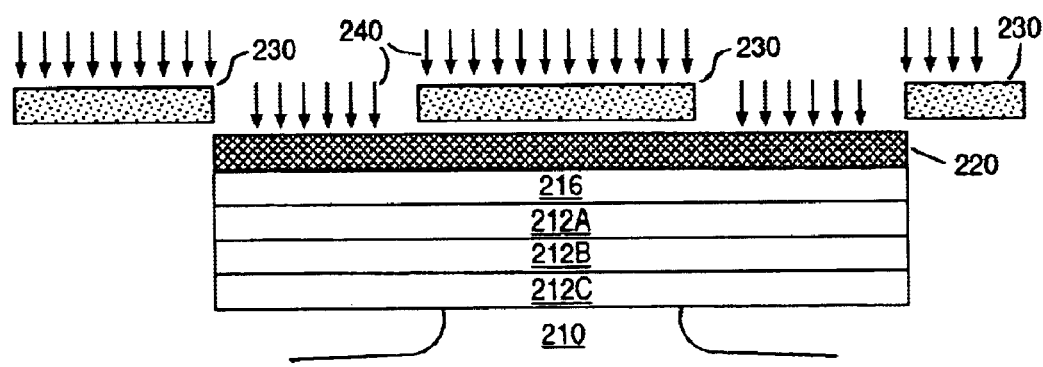
Figure 2C:
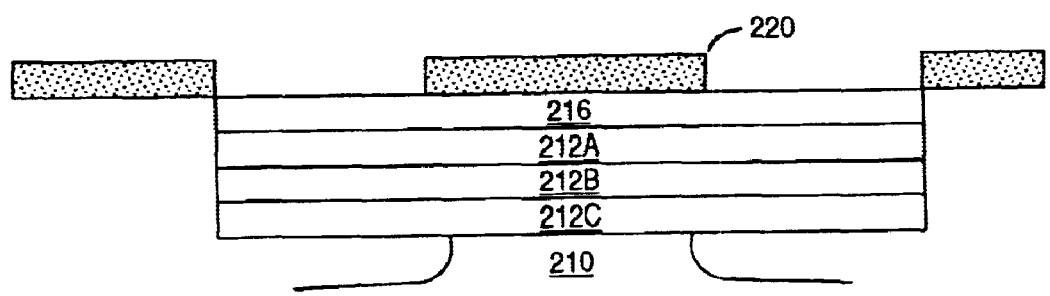
Figure 2D:
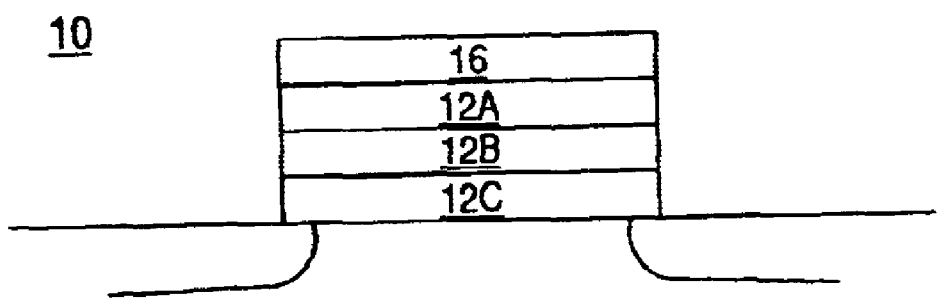

As an additional benefit of embodiments of the present invention, silicon nitride grown at a corner of a tunnel oxide and a substrate, for example in corner 640, beneficially protects the corner of such a structure during subsequent implantation to form a source/drain region, for example source drain region 14 of FIG. 1 (conventional art).

In this novel manner, gate stack edge defects may be physically repaired without deleterious consequences to the electrical behavior of a metal oxide semiconductor device. The novel application of silicon nitride to this application allows thin repair layers to be grown. Beneficially, such thin layers do not contribute non-uniform discontinuities to tunnel oxide layers. Advantageously, semiconductors manufactured using embodiments of the present invention may utilize smaller process feature sizes, resulting in denser arrays of semiconductor devices, resulting in lower costs for such devices and realizing a competitive advantage to practitioners of the improvements in the arts herein described.

Embodiments of the present invention provide a means to repair damage to gate stack oxides. Further embodiments of the present invention provide for repairing gate stack oxides in flash memory devices without contributing to wide erase threshold voltage distributions. Still further embodiments of the present invention provide for the above mentioned solutions to be achieved with existing semiconductor processes and equipment without revamping well established tools and techniques.

The preferred embodiment of the present invention, nitrogen oxidation to reduce encroachment, is thus described. While the present invention has been described in particular embodiments, it should be appreciated that the present invention should not be construed as limited by such embodiments, but rather construed according to the below claims.

What is claimed is:

1. A method of manufacturing a metal oxide semiconductor comprising:

etching a gate structure of said metal oxide semiconductor;

flowing a nitrogen-comprising gas over said metal oxide semiconductor; and growing a pre-implant film over edges of said gate structure.

2. The method of manufacturing a metal oxide semiconductor as described in claim 1 wherein said pre-implant film is less than 60 angstroms thick.

3. The method of manufacturing a metal oxide semiconductor as described in claim 1 wherein said nitrogen-comprising gas is substantially NO.

4. The method of manufacturing a metal oxide semiconductor as described in claim 1 wherein said nitrogen-comprising gas is substantially $N_2O$.

5. The method of manufacturing a metal oxide semiconductor as described in claim 1 further comprising implanting a source region subsequent to said growing.

6. The method of manufacturing a metal oxide semiconductor as described in claim 1 wherein said pre-implant film comprises nitrogen.

7. The method of manufacturing a metal oxide semiconductor as described in claim 6 wherein said pre-implant film is substantially silicon nitride.

8. A method of repairing edge defects in a gate stack comprising:

placing a wafer comprising semiconductors with gate stack edge defects into an oven;

flowing a nitrogen-comprising gas over said gate stack; and growing a pre-implant film over edges of said gate structure to repair said edge defects.

9. The method of repairing edge defects in a gate stack as described in claim 8 wherein said pre-implant film is less than 60 angstroms thick.

10. The method of repairing edge defects in a gate stack as described in claim 8 wherein said nitrogen-comprising gas is substantially NO.

11. The method of repairing edge defects in a gate stack as described in claim 8 wherein said nitrogen-comprising gas is substantially $N_2O$.

12. The method of repairing edge defects in a gate stack in claim 8 further comprising implanting a source region subsequent to said growing.

13. The method of repairing edge defects in a gate stack as described in claim 8 wherein said pre-implant film comprises nitrogen.

14. The method of manufacturing a metal oxide semiconductor as described in claim 13 wherein said pre-implant film is substantially silicon nitride.

\* \* \* \* \*